United States Patent
Cepulis

(10) Patent No.: US 9,195,588 B2
(45) Date of Patent: Nov. 24, 2015

(54) SOLID-STATE DISK (SSD) MANAGEMENT

(75) Inventor: Darren J. Cepulis, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 226 days.

(21) Appl. No.: 13/822,249

(22) PCT Filed: Nov. 2, 2010

(86) PCT No.: PCT/US2010/055158
§ 371 (c)(1),
(2), (4) Date: Mar. 11, 2013

(87) PCT Pub. No.: WO2012/060824
PCT Pub. Date: May 10, 2012

(65) Prior Publication Data
US 2013/0179631 A1    Jul. 11, 2013

(51) Int. Cl.
*G06F 3/06* (2006.01)
*G06F 12/02* (2006.01)
*G11C 16/34* (2006.01)

(52) U.S. Cl.
CPC .......... *G06F 12/0246* (2013.01); *G06F 3/0604* (2013.01); *G06F 3/0616* (2013.01); *G06F 3/0635* (2013.01); *G06F 3/0653* (2013.01); *G06F 3/0688* (2013.01); *G06F 2206/1012* (2013.01); *G06F 2212/7211* (2013.01); *G11C 16/3495* (2013.01)

(58) Field of Classification Search
None
See application file for complete search history.

(56) References Cited

U.S. PATENT DOCUMENTS

| | | | |
|---|---|---|---|
| 7,865,761 B1 * | 1/2011 | Chilton | 714/2 |
| 8,239,617 B1 * | 8/2012 | Linnell | 711/103 |
| 2004/0177143 A1 | 9/2004 | Maciel et al. | |
| 2009/0055465 A1 * | 2/2009 | DePue et al. | 709/202 |
| 2009/0063895 A1 | 3/2009 | Smith | |
| 2010/0082890 A1 | 4/2010 | Heo et al. | |
| 2010/0088461 A1 | 4/2010 | Yang et al. | |
| 2010/0174851 A1 * | 7/2010 | Leibowitz et al. | 711/103 |
| 2010/0250831 A1 * | 9/2010 | O'Brien et al. | 711/103 |
| 2011/0010487 A1 * | 1/2011 | Sadovsky et al. | 711/103 |
| 2011/0060865 A1 * | 3/2011 | Warren et al. | 711/103 |
| 2011/0307679 A1 * | 12/2011 | Roberts et al. | 711/170 |
| 2013/0179624 A1 * | 7/2013 | Lambert et al. | 711/103 |
| 2014/0068153 A1 * | 3/2014 | GU et al. | 711/103 |

OTHER PUBLICATIONS

Racherla et al. IBM Midrange System Storage Hardware Guide. Mar. 2010. IBM. $2^{nd}$ ed. pp. 285-292, 429-435, 527-534.*
Pinheiro et al. "Failure Trends in a Large Disk Drive Population." Feb. 2007. USENIX. FAST '07.*
Mark Anderson et al. "Performance Value of Solid State Drives using IBM i." May 2009. IBM. http://www.ibm.com/systems/resources/ssd_ibmi.pdf.*
Clodoaldo Barrera et al, Solid State Disks for Enterprise Storage (Research Paper), Feb. 2009, 16 Pages.
http://www.hdsentinel.com/hard_disk_sentinel_enterprise.php, Mar. 2013.
http://www.hdsentinel.com/index.php , Mar. 2013.
International Searching Authority, The International Search Report and the Written Opinion, Aug. 29, 2011, 8 Pages.
Pariseau Beth, http://searchstorage.techtarget.com/news/article/0,289142,sid5_gci1362680,00.html, Jul. 24, 2009.

* cited by examiner

*Primary Examiner* — Nathan Sadler
(74) *Attorney, Agent, or Firm* — Clifton L. Anderson

(57) ABSTRACT

SSD wear-level data (320) is generated on managed nodes (202) having SSDs (206). The wear-level data is collected by a management node (204).

13 Claims, 3 Drawing Sheets

SOLID-STATE DISK (SSD) MANAGEMENT

BACKGROUND

Large computer installations can have thousands of components subject to failure and replacement. Accordingly, some computer management approaches monitor computer system health, e.g., by keeping track of data errors (even if they were corrected). Devices that generate excessive data errors can be targeted for replacement prior to a predicted failure. For example, hard disks can include controllers that detect and correct data errors and then log the occurrence of the error. Such techniques may also be applied to solid-state-disks (SSDs) which provide for higher performance than hard disks for increasingly affordable costs.

DETAILED DESCRIPTION

Figure 1:
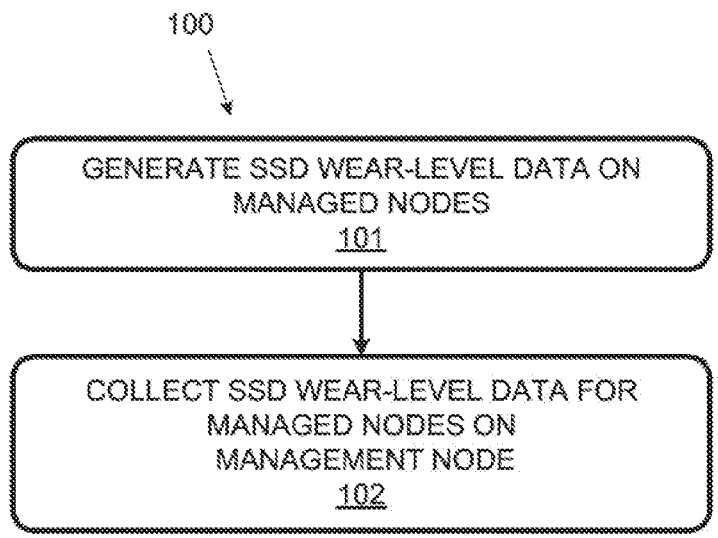
FIG. 1 is a flow chart of an SSD management process in accordance with an embodiment.

A process 100, flow charted in FIG. 1, includes a process segment 101 of generating SSD wear-level data on managed (computer) nodes, and collecting the generated wear-level data on a management node at process segment 102. Collecting wear-level data allows SSDs to be managed more as supplies (e.g., such as ink and toner cartridges) than as equipment, (e.g., such as hard disks). SSDs can accept only a limited number of writes before failure becomes likely. By tracking wear-level (a parameter related to the number of writes), failures can be anticipated much more reliably and earlier than hard disk failures are predicted using error events. Thus, planning for SSD replacements becomes more certain. Furthermore, the wear-level data can be used to adjust the workloads relying on an SSD to lengthen (or shorten) its useful lifetime.

Figure 2:
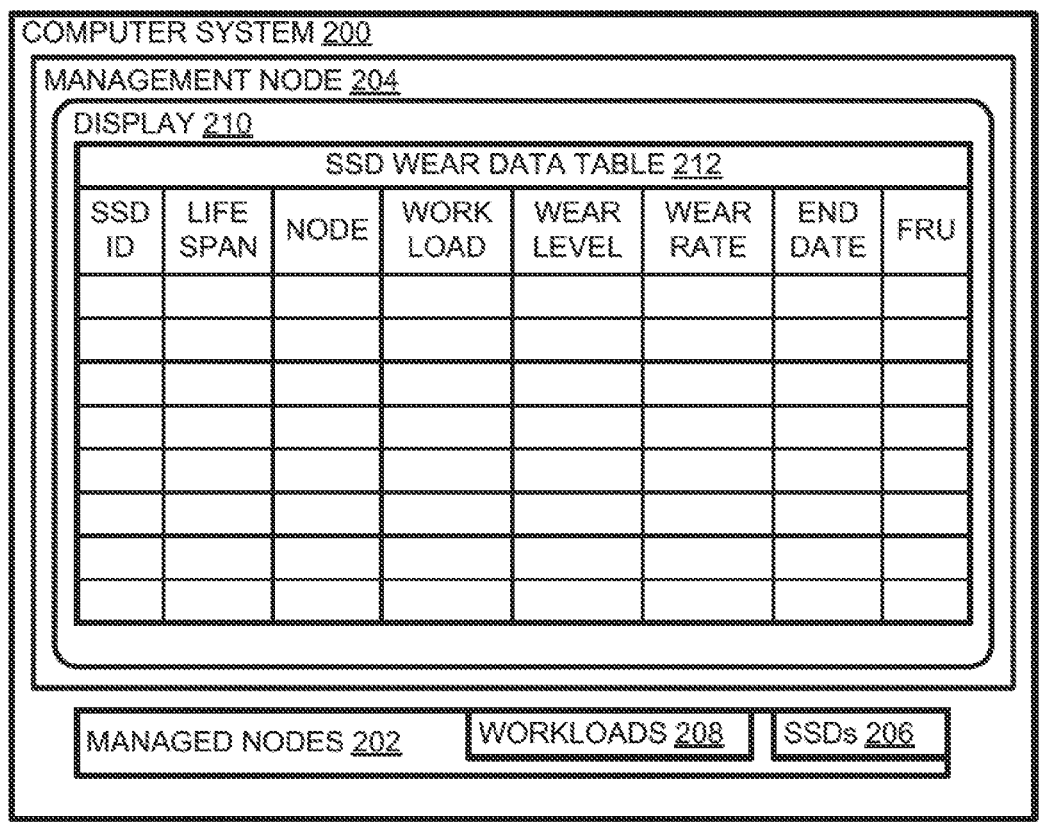
FIG. 2 is a block diagram of a computer system configured to employ the process of FIG. 1.

For example, a computer system 200 includes managed nodes 202 and a management node 204, as shown in FIG. 2. Managed nodes 202 can include SSDs 206 and run workloads 208 that access SSDs 206. Management node 204 includes a display 210 for displaying a table 212 of (shown unpopulated in FIG. 2) of SSD wear data. Table 212 associates wear-level data collected from managed nodes 202 with identities of the respective SSDs, their (manufacturer-specified) estimated life spans, workloads, and nodes. Life span can be represented as a number of writes, while wear-level can be represented as a percentage of the number of lifespan writes.

In addition, the SSD wear data of table 212 can include wear-rate data, which can be calculated by comparing previous and current wear-level data for an SSD. Also, the SSD wear data of table 212 can include end dates by which respective SSDs are to be replaced based on the current wear level and rate. Table 212 also includes an FRU (field-replaceable unit) field for identifying the recommended replacement component (e.g., SSD type and size or hard disk speed and size) for each SSD, En other embodiments, wear-level data is represented in other forms, and different parameters are associated with the wear-level data; for example, wear-level data can be represented for different time slots.

Figure 3:
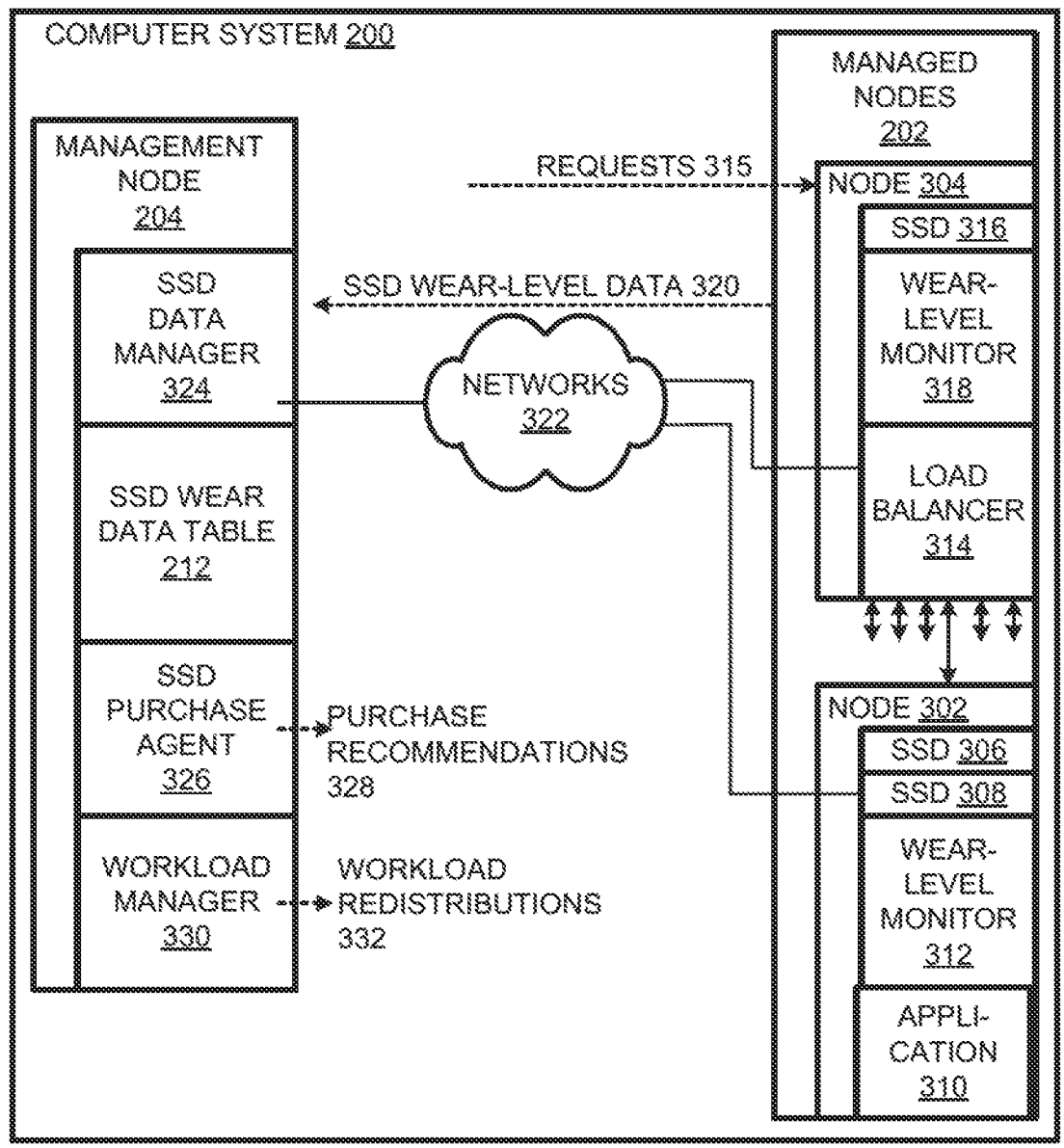
FIG. 3 is a more detailed block diagram of the system of FIG. 2.

As shown in FIG. 3, managed nodes 202 include application nodes such as node 302 and load balancing nodes, such as node 304. Application node 302 includes SSDs 306 and 308; node 302 is configured to execute an application 310 (e.g., a web server or a database) and an SSD wear-level monitor 312.

SSD monitor 312 can be implemented as a hardware-software combination. Embedded firmware on a drive controller, such as RAID (Redundant Array of Inexpensive Disks), HBA (Host Bus Adapter), etc., for node 302 can read the wear data from any SSD drives present and push this to an embedded Baseboard Management Chip (BMC). The BMC can log this data and make it visible over an out-of-band network to management node 204 via a Web-GUI (graphic user interface) and/or IPMI OEM (Intelligent Platform Interface, Original Equipment Manufacturer) command, or another industry standard mechanism. Also, storage management agents on each managed node can extract the SSD drive wear level data and communicate it to other nodes, e.g., management node 204 and/or load-balancing node 304 over an in-band network.

For example, SSD wear-level monitor 312 can transmit SSD wear-level data for SSDs 306 and 308 to load-balancing node 304. Load balancing node 304 is configured to distribute evenly incoming requests 315 among plural application nodes running instances of application 310. A load balancer 314 can base load balancing determination in part based on wear level data from the nodes its distributes to, e.g., to balance the rates at which SSD storage is written to across the nodes or to extend the remaining lifetimes of SSDs with more advanced wear levels.

Node 304 has its own SSD 316 and its own wear-level monitor 318, similar to wear-level monitor 312. Wear-level monitors, e.g., monitors 312 and 318, of managed nodes 202 can transmit their respective wear level data 320 to management node 204 via networks 322. Networks 322 can include an in-band network and an out-of-band management network connected to BMC-bearing internal lights out modules of managed nodes 202.

Wear-level data 320 is received by SSD data manager 324 of management node 204. Data manager 224 stores collected wear level data in table 212 in association with the SSDs and the nodes which generated the data. The wear-level and wear-rate data in table 212 can be extrapolated to project ends of the useful lifetimes of respective SSDs. The projected end dates can be used by SSD purchase agent 326 of management node 204 in making purchase recommendations 328 for SSD replacements. The projections may be made far enough in advance to take advantage of sales and quantity discounts.

A workload manager 330 can make use of the data in table 212 in planning workload redistributions 332. For example, if SSD 306 is suffering from an advanced wear level and a high wear rate, workload manager 324 can place the workload running on node 302 with a less demanding workload to extend the useful life (in days) of SSD 306. Also, workload manager 330 can manage workloads so that not all SSDs are replaced at once. For example, workload manager 330 can act to ensure that the date SSD 306 is to be replaced is not close to the date SSD 308 is to be replaced. This will allow node 302 to continue uninterrupted operation while a replacement SSD is purchased and hot-swapped for SSD 306. Other wear-level management programs can be implemented in accordance with the desires of the owner of computer system 200.

Figure 4:
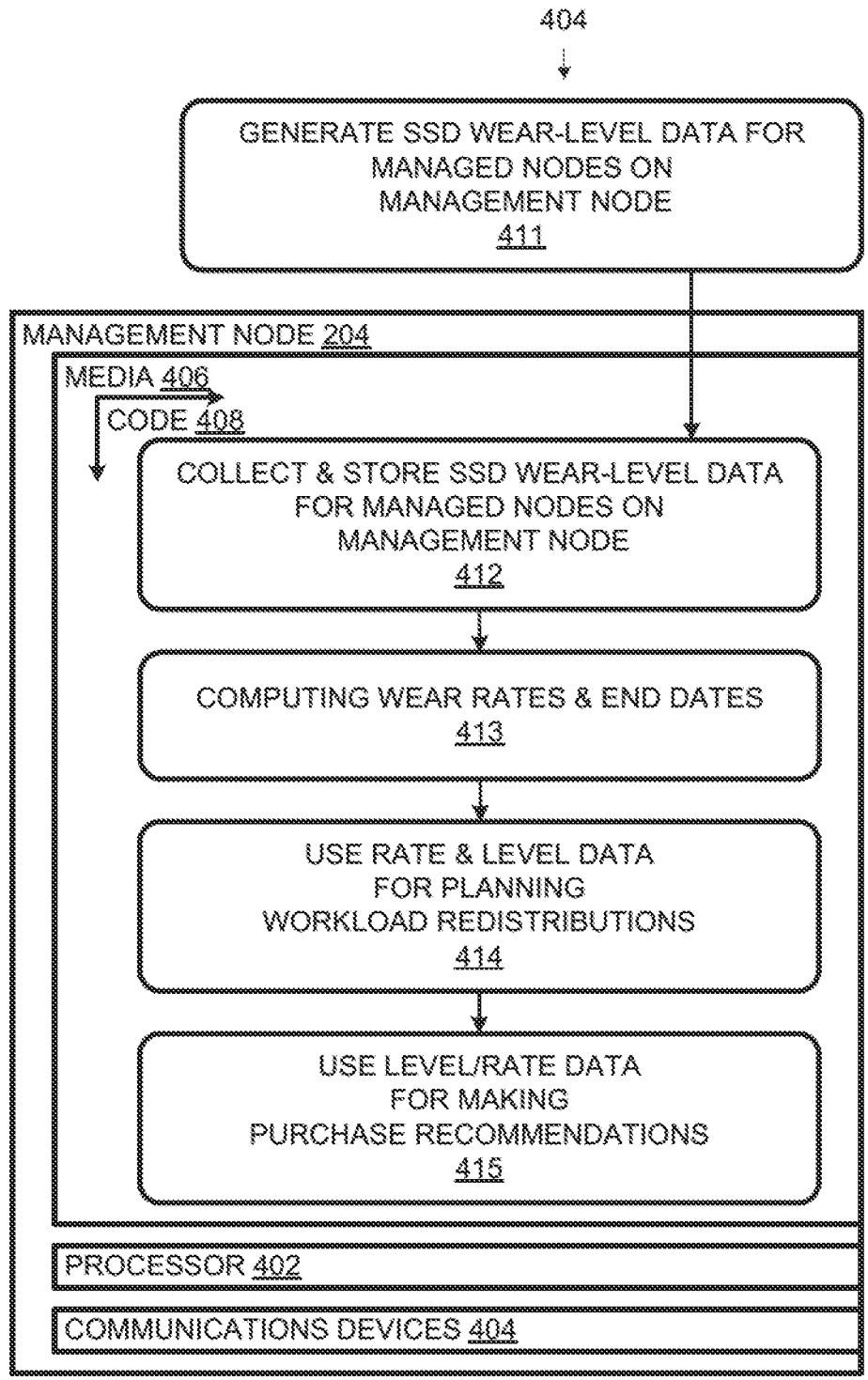
FIG. 4 is a combination block diagram and flow chart applicable to the system of FIG. 2.

As shown in FIG. 4, management node 204 includes a processor 402 (which can be a set of integrated circuits in a multi-processor or multi-core arrangement), communications devices 404 (including network interface cards, host bus adapters, and graphics and human (input/output) interface devices, and storage media 406. Storage media 406 can be encoded with, code 408 defining table 212, SSD data manager 324, SSD purchase agent 326, and workload manager 330.

Code 408 is configured to implement a process 404, flow charted in FIG. 4. At process segment 411 SSD monitors, including monitors 312 and 318, collect SSD wear-level data from respective nodes. They then transmit the data in association with data identifying the associated SSDs, nodes, and workloads.

At process segment 412, SSD data manager 324 receives, collects, and stores data from the managed nodes, SSD data manager 324 organizes the collected data and stores it in table 212. At process segment 413, wear rates can be computed by comparing current wear levels with past wear levels. Also, projected end dates can be computed from wear-levels and wear-rates.

At process segment 414, workload manager 330 uses the wear-level and wear-rate data as factors in determining periodic workload redistributions. Other factors may include processor utilization, communications bandwidth utilization, power consumption, etc. The workload redistribution can be used to extend the lifetimes of heavily used SSDs, to implement a conveniently staggered replacement policy, or implement other management policies.

At process segment 415, SSD purchase agent 326 uses the wear level and wear rate data in making purchase recommendations. The wear-level and wear-rate data can be extrapolated to project an end of useful life data for each SSD. If replacement SSDs are to be replaced in batches, process segment 415 can provide for identifying which SSDs are to be replaced in the next batch rather than some batch to be purchased further in the future. Also, process segment 415 can make recommendations to replace an SSD with a hard disk, e.g., where there are frequent writes and performance can be less than maximal.

Herein, "storage media" refers to non-transitory tangible computer-readable storage media. Herein "code" refers to computer-readable data and computer-executable instructions. Herein, a "processor" is hardware configured to execute computer-executable instructions, whether that hardware is embodied in a single element (e.g. an integrated circuit) or distributed among plural elements. Herein, a "communications device" is a hardware element used to receive data into a node or transmit data from a node or both. Herein, a "node" is a computer element including a processor, storage media, and at least one communications device.

Herein, "SSD wear level data" includes data indicating the wear level of an SSD, e.g., in terms of a number of write operations or as a percent of estimated SSD lifespan. "SSD wear level data" also encompasses associated data such data identifying the relevant SSD, node, and workload. "SSD wear data" encompasses SSD wear level data and other data (e.g., wear rate and end date) computed using the SSD wear level data.

Herein, a "system" is a set of interacting elements, wherein the elements can be, by way of example and not of limitation, mechanical components, electrical elements, atoms, instructions encoded in storage media, and process segments. In this specification, related art is discussed for expository purposes. Related art labeled "prior art", if any, is admitted prior art. Related art not labeled "prior art" is not admitted prior art. The illustrated and other described embodiments, as well as modifications thereto and variations thereupon are within the scope of the following claims.

What is claimed is:

1. A method comprising:
   generating solid-state disk (SSD) wear-level data on managed nodes having SSDs;
   collecting said SSD wear-level data on a management node; and
   balancing, by at least one of said managed nodes, loads among other ones of said managed nodes as a function of said wear-level data.

2. The method as recited in claim 1 wherein said collecting further includes storing in a database of SSD wear data including said SSD wear-level data in association with data identifying an associated SSD and an associated managed node including the associated SSD.

3. The method as recited in claim 2 further comprising computing wear-rate data and storing it in said database as part of said SSD wear-level data.

4. The method as recited in claim 1 further comprising planning a workload redistribution at least in part as a function of said SSD wear-level data.

5. The method as recited in claim 1 further comprising making purchase recommendations at least in part as a function of said SSD wear-level data.

6. The process as recited in claim 1, further comprising:
   determining a frequency of writes to an SSD of the SSDs; and
   determining a recommendation to replace the SSD with a hard disk or a replacement SSD, wherein if performance is determined to be less than maximal according to the frequency of writes, the recommendation is to replace the SSD with the hard drive; otherwise the recommendation is to replace the SSD with the replacement SSD.

7. A computer system comprising:
   a management node having an SSD data manager to collect SSD wear-level data from managed nodes having SSDs, said management node including a processor, communications devices, and storage media,
   wherein said management node includes an SSD purchase agent to determine a frequency of writes to an SSD of the SSDs, and make a recommendation to replace the SSD with a hard disk or a replacement SSD, and if performance is determined to be less than maximal according to the frequency of writes, the recommendation is to replace the SSD with the hard drive; otherwise the recommendation is to replace the SSD with the replacement SSD, and
   wherein at least one of said managed nodes is to balance loads among other ones of said managed nodes at least in part as a function of said wear-level data.

8. The computer system as recited in claim 7 wherein the SSD purchase agent determines to replace the SSD based on SSD wear-level rate of the SSD.

9. The computer system as recited in claim 7 wherein said management node includes a workload manager to plan workload redistributions on said managed node at least in part as a function of said SSD wear-level data.

10. A managed node of a plurality of managed nodes, each having an SSD, the managed node comprising a processor to collect SSD wear-level data from other ones of the plurality of managed nodes, and balance loads among the ones of said managed nodes as a function of said SSD wear-level data of the other ones of said managed nodes.

11. The managed node as recited in claim 10 wherein a management node is to collect SSD wear-level data of the plurality of managed nodes, including said SSD wear-level data of the other ones of said managed nodes, and to plan workload redistributions so as to stagger the times at which useful lives of the SSDs of the plurality of managed nodes are projected to end.

12. The managed node as recited in claim 11 wherein the management node is to make recommendations regarding purchase of replacement SSDs for said managed nodes at least in part as a function of said SSD wear-level data of the plurality of managed nodes.

13. The management node as recited in claim 11, wherein the management node is to determine a frequency of writes to an SSD of the SSDs, and make a recommendation to replace the SSD with a hard disk or a replacement SSD, wherein if performance is determined to be less than maximal according to the frequency of writes, the recommendation is to replace the SSD with the hard drive; otherwise the recommendation is to replace the SSD with the replacement SSD.

\* \* \* \* \*